(12) United States Patent
Zhang et al.

(10) Patent No.: US 8,996,971 B2
(45) Date of Patent: Mar. 31, 2015

(54) LDPC DECODER TRAPPING SET IDENTIFICATION

(75) Inventors: Fan Zhang, Milpitas, CA (US); Anatoli A. Bolotov, San Jose, CA (US); Lav D. Ivanovic, Sunnyvale, CA (US)

(73) Assignee: LSI Corporation, Milpitas, CA (US)

( * ) Notice: Subject to any disclaimer, the term of this patent is extended or adjusted under 35 U.S.C. 154(b) by 213 days.

(21) Appl. No.: 13/602,440

(22) Filed: Sep. 4, 2012

(65) Prior Publication Data

US 2014/0068367 A1    Mar. 6, 2014

(51) Int. Cl.
*G06F 11/00*    (2006.01)
*H03M 13/00*    (2006.01)
*H03M 13/11*    (2006.01)
*G06F 11/10*    (2006.01)

(52) U.S. Cl.
CPC ....... *H03M 13/1102* (2013.01); *G06F 11/1076* (2013.01)
USPC ........................................................ 714/800

(58) Field of Classification Search
CPC ........................ H03M 13/1102; G06F 11/1076
USPC ........................... 714/746, 703, 760, 800–801
See application file for complete search history.

(56) References Cited

U.S. PATENT DOCUMENTS

| | | | |
|---|---|---|---|
| 5,701,314 A | 12/1997 | Armstrong | |
| 5,712,861 A | 1/1998 | Inoue | |
| 6,438,717 B1 | 8/2002 | Butler | |
| 6,657,803 B1 | 12/2003 | Ling | |
| 6,842,872 B2 * | 1/2005 | Yedida et al. | 714/703 |
| 7,136,244 B1 | 11/2006 | Rothberg | |
| 7,516,389 B2 * | 4/2009 | Song | 714/755 |
| 7,702,989 B2 | 4/2010 | Graef | |
| 7,730,384 B2 | 6/2010 | Graef | |
| 7,738,201 B2 | 6/2010 | Jin | |
| 7,971,125 B2 | 6/2011 | Graef | |
| 7,990,642 B2 | 8/2011 | Lee | |
| 8,176,404 B2 | 5/2012 | Yang | |
| 8,301,979 B2 * | 10/2012 | Sharon et al. | 714/763 |
| 8,595,589 B2 * | 11/2013 | Yedidia et al. | 714/758 |
| 2011/0080211 A1 | 4/2011 | Yang | |
| 2011/0083058 A1 * | 4/2011 | Hu et al. | 714/758 |
| 2011/0161633 A1 | 6/2011 | Xu | |
| 2011/0231731 A1 * | 9/2011 | Gross et al. | 714/760 |
| 2012/0200954 A1 | 8/2012 | Jin | |
| 2012/0236429 A1 | 9/2012 | Yang | |

OTHER PUBLICATIONS

Olmos et al., "Tree-Structure Expectation Propagation for LDPC Decoding in Erasure Channels", Cornell University Library arXiv:1009.4287 (Sep. 22, 2010).
U.S. Appl. No. 13/326,363, Unpublished, (filed Dec. 15, 2011) (Fan Zhang).
U.S. Appl. No. 13/490,849, Unpublished, (filed Jun. 7, 2012) (Johnson Yen).
U.S. Appl. No. 13/465,214, Unpublished, (filed May 7, 2012) (Chung-Li Wang).
U.S. Appl. No. 13/560,737, Unpublished, (filed Jul. 27, 2012) (Weijun Tan).

(Continued)

*Primary Examiner* — Shelly A Chase
(74) *Attorney, Agent, or Firm* — Hamilton DeSanctis & Cha (57) ABSTRACT

The present inventions are related to systems and methods for detecting trapping sets in LDPC decoders, and particularly for detecting variable nodes in trapping sets in a non-erasure channel LDPC decoder.

20 Claims, 5 Drawing Sheets

(56) References Cited

OTHER PUBLICATIONS

U.S. Appl. No. 13/445,858, Unpublished, (filed Apr. 12, 2012) (Johnson Yen).
U.S. Appl. No. 13/412,492, Unpublished, (filed Mar. 5, 2012) (Shaohua Yang).
U.S. Appl. No. 13/474,672, Unpublished, (filed May 17, 2012) (Fan Zhang).
U.S. Appl. No. 13/459,282, Unpublished, (filed Apr. 30, 2012) (Fan Zhang).
U.S. Appl. No. 13/372,600, Unpublished, (filed Feb. 14, 2012) (Shaohua Yang).
U.S. Appl. No. 13/326,367, Unpublished, (filed Dec. 15, 2011) (Shaohua Yang).
U.S. Appl. No. 13/483,982, Unpublished, (filed May 30, 2012) (Yang Han).

\* cited by examiner

LDPC DECODER TRAPPING SET IDENTIFICATION

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, in perhaps the simplest system, a parity bit can be added to a group of data bits, ensuring that the group of data bits (including the parity bit) has either an even or odd number of ones. When using odd parity, as the data is prepared for storage or transmission, the number of data bits in the group that are set to one are counted, and if there is an even number of ones in the group, the parity bit is set to one to ensure that the group has an odd number of ones. If there is an odd number of ones in the group, the parity bit is set to zero to ensure that the group has an odd number of ones. After the data is retrieved from storage or received from transmission, the parity can again be checked, and if the group has an even parity, at least one error has been introduced in the data. At this simplistic level, some errors can be detected but not corrected.

Figure 1:
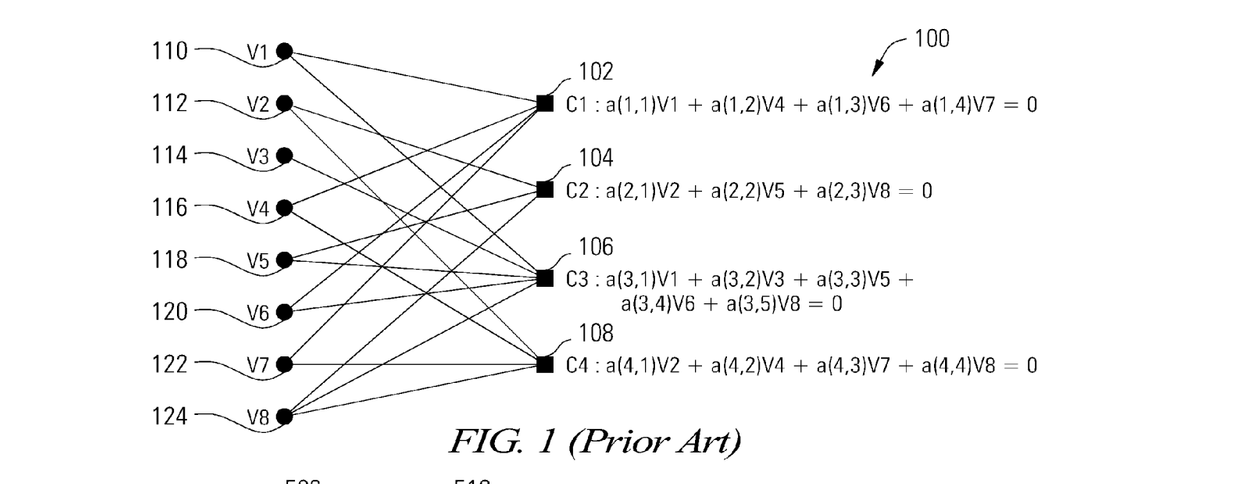
FIG. 1 depicts a Tanner graph of an example prior art LDPC code.

The parity bit may also be used in error correction systems, including in Low Density Parity Check (LDPC) decoders. An LDPC code is a parity-based code that can be visually represented in a Tanner graph 100 as illustrated in FIG. 1. In an LDPC decoder, multiple parity checks are performed in a number of check nodes 102, 104, 106 and 108 for a group of variable nodes 110, 112, 114, 116, 118, 120, 122, and 124. The connections (or edges) between variable nodes 110-124 and check nodes 102-108 are selected as the LDPC code is designed, balancing the strength of the code against the complexity of the decoder required to execute the LDPC code as data is obtained. The number and placement of parity bits in the group are selected as the LDPC code is designed. Messages are passed between connected variable nodes 110-124 and check nodes 102-108 in an iterative process, passing beliefs about the values that should appear in variable nodes 110-124 to connected check nodes 102-108. Parity checks are performed in the check nodes 102-108 based on the messages and the results are returned to connected variable nodes 110-124 to update the beliefs if necessary. LDPC decoders may be implemented in binary or non-binary fashion. In a binary LDPC decoder, variable nodes 110-124 contain scalar values based on a group of data and parity bits that are retrieved from a storage device, received by a transmission system or obtained in some other way. Messages in the binary LDPC decoders are scalar values transmitted as plain-likelihood probability values or log-likelihood-ratio (LLR) values representing the probability that the sending variable node contains a particular value. In a non-binary LDPC decoder, variable nodes 110-124 contain symbols from a Galois Field, a finite field $GF(p^k)$ that contains a finite number of elements, characterized by size $p^k$ where p is a prime number and k is a positive integer. Messages in the non-binary LDPC decoders are multi-dimensional vectors, generally either plain-likelihood probability vectors or LLR vectors.

The connections between variable nodes 110-124 and check nodes 102-108 may be presented in matrix form as follows, where columns represent variable nodes, rows represent check nodes, and a random non-zero element a(i,j) from the Galois Field at the intersection of a variable node column and a check node row indicates a connection between that variable node and check node and provides a permutation for messages between that variable node and check node:

$$H = \begin{bmatrix} a(1,1) & 0 & 0 & a(1,2) & 0 & a(1,3) & a(1,4) & 0 \\ 0 & a(2,1) & 0 & 0 & a(2,2) & 0 & 0 & a(2,3) \\ a(3,1) & 0 & a(3,2) & 0 & a(3,3) & a(3,4) & 0 & a(3,5) \\ 0 & a(4,1) & 0 & a(4,2) & 0 & 0 & a(4,3) & a(4,4) \end{bmatrix}$$

By providing multiple check nodes 102-108 for the group of variable nodes 110-124, redundancy in error checking is provided, enabling errors to be corrected as well as detected. Each check node 102-108 performs a parity check on bits or symbols passed as messages from its neighboring (or connected) variable nodes. In the example LDPC code corresponding to the Tanner graph 100 of FIG. 1, check node 102 checks the parity of variable nodes 110, 116, 120 and 122. Values are passed back and forth between connected variable nodes 110-124 and check nodes 102-108 in an iterative process until the LDPC code converges on a value for the group of data and parity bits in the variable nodes 110-124. For example, variable node 110 passes messages to check nodes 102 and 106. Check node 102 passes messages back to variable nodes 110, 116, 120 and 122. The messages between variable nodes 110-124 and check nodes 102-108 are probabilities or beliefs, thus the LDPC decoding algorithm is also referred to as a belief propagation algorithm. Each message from a node represents the probability that a bit or symbol has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed based on the current value of the check node and the last messages to the check node from neighboring variable nodes, except that the last message from that particular variable node is omitted from the calculation to prevent positive feedback. As local decoding iterations are performed in the system, messages pass back and forth between variable nodes 110-124 and check nodes 102-108, with the values in the nodes 102-124 being adjusted based on the messages that are passed, until the values converge and stop changing or until processing is halted.

The LDPC code (or matrix) is carefully designed to provide good error detection and correction, while using a small number of parity bits. However, trapping sets, or groups of variable nodes in which errors can be trapped, may exist in LDPC codes, reducing the likelihood of successful decoding.

BRIEF SUMMARY

The present inventions are related to systems and methods for detecting trapping sets in LDPC decoders, and particularly for detecting variable nodes in trapping sets in a non-erasure channel LDPC decoder. In some embodiments, trapping set identification is performed in a probabilistic manner based at least in part on disagreements between check node to variable node messages to a variable node. In some embodiments, a trapping set is detected when the number of unsatisfied parity checks in the decoder is within a predetermined range for a given number of consecutive local decoding iterations. Variable nodes in the trapping set are identified as those associated with the unsatisfied parity checks for which there is a disagreement between received check node to variable node messages. In some embodiments, the variable nodes are identified in the first local iteration of a global iteration.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification.

DETAILED DESCRIPTION OF THE INVENTION

The present inventions are related to systems and methods for detecting trapping sets in LDPC decoders, and particularly for detecting variable nodes in trapping sets in a non-erasure channel LDPC decoder. The LDPC decoder used in various embodiments may be any type of LDPC decoder, including binary and non-binary, layered and non-layered. LDPC technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

A trapping set is defined herein as variable nodes and check nodes forming a subset of those in a Tanner graph where belief propagation decoding fails to converge or gets stuck. Belief propagation decoding can have a massive failure in which the number of unsatisfied parity checks is large, typically caused by poor signal to noise ratio (SNR), or with a mid-size failure due to clusters of interconnected trapping sets, or with a small failure with isolated trapping sets. In the latter two cases with trapping set failures, if the trapping sets can be identified, error recovery or retry schemes may be implemented in the LDPC decoder, such as targeted symbol flipping, bit selective scaling (BSS), extrinsic LLR adjusting or parity forcing, locally maximum-likelihood (ML) decoding, dynamic vscaling in a detector, dynamic LDPC scaling/offset, etc. Such error recovery schemes may be performed in the LDPC decoder or in surrounding system components, such as in the output of an upstream data detector that provides the input to the LDPC decoder.

Figure 2:
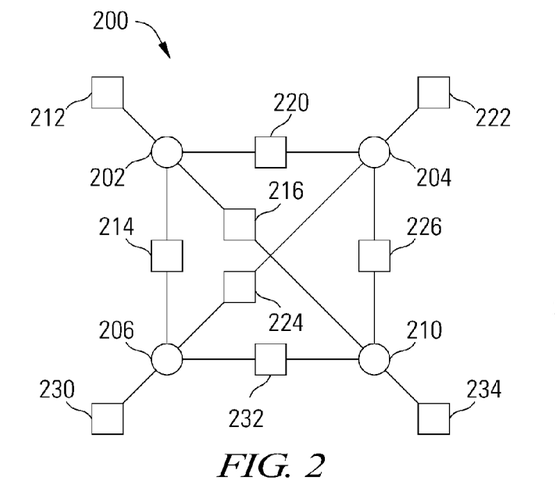
FIG. 2 depicts an example trapping set in an LDPC code.

Turning to FIG. 2, a simple trapping set 200 in an LDPC code is depicted to illustrate how errors can be trapped during decoding. (Note that the number of connected variable nodes and check nodes, and the number of connections for each variable node and check node, is merely an example and may not be applicable to every LDPC code or every LCPD decoder.) The example trapping set 200 includes four variable nodes 202, 204, 206 and 210. Variable node 202 is connected to four check nodes 212, 214, 216 and 220. Variable node 204 is connected to four check nodes 220, 222, 224 and 226. Variable node 206 is connected to four check nodes 214, 224, 230 and 232. Variable node 210 is connected to four check nodes 216, 226, 232 and 234.

Variable nodes 202, 204, 206 and 210 form a trapping set 200. If all four variable nodes 202, 204, 206 and 210 have errors in their bit or symbol values, these errors will tend to be trapped. Check nodes 214, 216, 220, 224, 226 and 232 are connected only to variable nodes 202, 204, 206 and 210 within the trapping set 200. The parity checks performed by these check nodes 214, 216, 220, 224, 226 and 232 may pass even if the values in the variable nodes 202, 204, 206 and 210 are incorrect. For example, if both variable nodes 202 and 206 contain erroneous bit values of 0 instead of correct bit values of 1, the parity check performed in check node 214 will pass because both inputs from variable nodes 202 and 206 are incorrect. Similarly, if both variable nodes 202 and 210 contain incorrect values, the parity check performed in check node 216 will pass.

If majority rules voting or similar systems are used to reconcile the parity checks for a particular variable node in the trapping set 200, the error is trapped rather than corrected. For example, if check nodes 214, 224 and 232 all incorrectly report that variable node 206 contains the correct data value, the variable node 206 will maintain the incorrect data value, even if check node 230 reports that it is an error based on other variable nodes (not shown) that are connected to check node 230. In other words, even if the parity check performed in check node 230 fails because the error in variable node 206 does not combine with values from other variable nodes (not shown) connected to check node 230 to pass the parity check, the error report from check node 230 will be overruled by the mistaken reports from check nodes 214, 224 and 232 indicating that variable node 206 is correct.

Again, trapping set 200 is only an example, and the trapping set identification disclosed herein may be used to detect variable nodes in trapping sets in a variety of LDPC codes and conditions.

The trapping set identification disclosed herein is particularly useful in non-erasure channel LDPC decoders. Although it may also be applied in erasure channel LDPC decoders, trapping set identification is generally not a problem in erasure channel LDPC decoders. For example, in an erasure channel LDPC decoder implementing a belief propagation or peeling algorithm, variable nodes are removed from the Tanner graph during decoding as they are identified as being correct. If a check node is connected to only one variable node, the variable node value must be 0 because the check node must be 0 to satisfy the parity check, and the variable node can be removed from the Tanner graph. The Tanner graph is thus naturally reduced during decoding, and when all variable nodes have been removed, leaving an empty Tanner graph, decoding is successful. If, however, during decoding a point is reached at which no more variable nodes can be identified as correct and removed, the decoding has failed to converge and the remaining variable nodes form a trapping set.

In contrast, in a non-erasure channel (e.g., AWGN, PR, q-SC, etc.) LDPC decoder, the Tanner graph is not changed during decoding. No variable nodes are removed as they are identified as correct. Only messages in the decoder are changed, and the Tanner graph remains fixed. Generally, decoding continues until all parity checks are satisfied or until the limit on the maximum number of local decoding iterations has been reached. Therefore, identifying a trapping set in a non-erasure channel is much more difficult. While visibility of check node checksums in the LDPC decoder enables the check nodes in a trapping set to be identified, variable nodes in a trapping set in a non-erasure channel LDPC decoder cannot be identified with absolute certainty.

The trapping set identification disclosed herein implements a probabilistic approach to detecting variable nodes and check nodes in a trapping set, or to identify the indices of the variable nodes and check nodes in the trapping set. Based on the channel statistics, the trapping set is identified using check node to variable node (C2V) message disagreements or conflicts. Again, a C2V message is a message 300, 302 or 304 (see FIG. 3) from a check node 310, 312, or 314 to a variable node 316. A variable node 316 may be connected to one or more check nodes 310, 312, 314, with the connections determined by the Tanner graph for the LDPC code. A check node 310, 312, 314 may be connected to one or more variable nodes 316. The Tanner graph for the entire LDPC code thus forms an interconnected web of check nodes and variable nodes, with the variable nodes holding the perceived values of each data bit or symbol, and the check nodes performing parity checks on the perceived values of connected variable nodes. The variable nodes pass their perceived values to connected check nodes in variable node to check node (V2C) messages. The check nodes pass back the values they perceive for variable nodes based on the parity checks in C2V messages, enabling the perceived variable node values to be updated based on the C2V messages.

Figure 3:
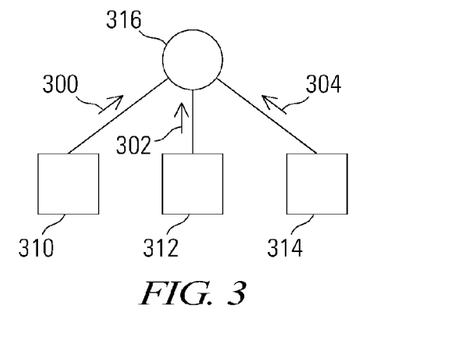
FIG. 3 depicts a variable node receiving C2V messages from three connected check nodes as may take place in the Tanner graph of an LDPC code.

A C2V message disagreement exists when one or more of the C2V messages 300, 302 and 304 has a different perceived value for the variable node 316. A disagreement in C2V messages 300, 302 and 304 about the perceived value for the variable node 316 is an indication that the variable node 316 is or may be incorrect. However, as the number of local decoding iterations performed in the LDPC decoder increases, the correlation between check nodes 310, 312 and 314 also increases, reducing the independence between the C2V messages 300, 302 and 304. Statistically, the greater the independence between the C2V messages 300, 302 and 304, the more likely that a disagreement in C2V messages 300, 302 and 304 represents an incorrect value in the variable node 316. As the number of local decoding iterations increases and the correlation between C2V messages 300, 302 and 304 increases, the more likely it is that the content of a C2V message 300, 302 or 304 has been influenced by other check nodes.

Figure 4:
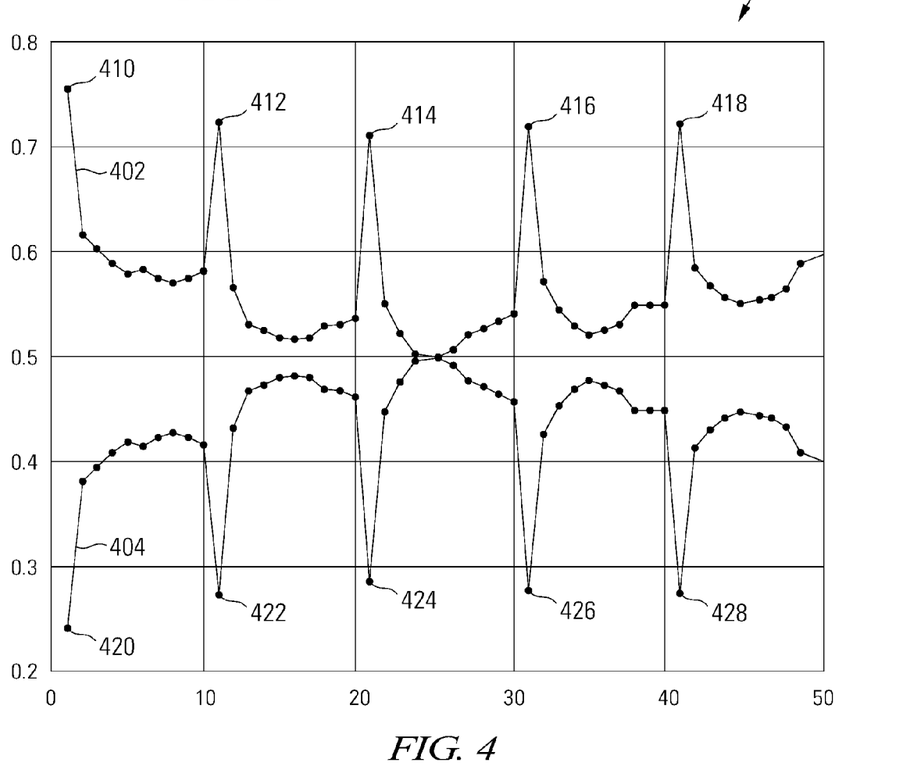
FIG. 4 depicts plots of the probability that a variable node has a correct value when all incoming C2V messages match (upper plot) and of the probability that a variable node has an incorrect value when all incoming C2V messages match (lower plot) for a variable node in a trapping set in accordance with some embodiments of the present inventions.

Turning to FIG. 4, this effect of the increasing correlation between C2V messages 300, 302 and 304 is illustrated in the graph 400 which shows a plot 402 of the probability that a variable node (e.g., 316) has a correct perceived value when all C2V messages (e.g., 300, 302, 304) are matching, and a plot 404 of the probability that a variable node (e.g., 316) has an incorrect perceived value when all C2V messages (e.g., 300, 302, 304) are matching. The X-axis corresponds to the iteration number, and the Y-axis corresponds to the probability, thus varying between 0 and 1. Note that the probability that a variable node has an incorrect value and the probability that the variable node has a correct value sums to 1 at any given iteration number. In this example, the graph 400 covers about 50 iterations, including 5 global iterations and 10 local iterations per global iteration. (A local iteration is a decoding pass on input data performed within an LDPC decoder, a global iteration is a data processing pass within a data processing system that includes the LDPC decoder as well as other data processing components.)

At certain global and local iterations, variable nodes with incorrect perceived values have more conflicts between received C2V messages. This means that there is better correlation between probability of an incorrect perceived value in a variable node and received C2V message disagreement at these particular iterations. As shown in FIG. 4, the best correlation between probability of incorrect perceived variable node value and C2V message disagreement is at the first local iteration of each global iteration, taking place at iterations 1, 11, 21, 31 and 41 in this example. The separation between the probability of correct perceived value and incorrect perceived value when C2V messages are matching is greatest at the first local iteration of each global iteration, illustrated by the corresponding peaks 410, 412, 414, 416 and 418 in plot 400 and the valleys 420, 422, 424, 426 and 428 of plot 404. This is because local iterations in the LDPC decoder increase the correlation between C2V messages received by a variable node, while external processing such as in a Viterbi detector during global iterations increases the independence of values in the LDPC decoder and thus of the messages passed in the LDPC decoder. When the C2V messages are most independent, a disagreement or conflict between the C2V messages received by a variable node most likely to be a correct indication that the perceived value in the variable node is incorrect.

Again, the plot 402 is the probability that the perceived value in a variable node is correct when all received C2V messages match. Notably, this is not simply the probability that the perceived value in a variable node is correct, but the probability that the received C2V messages are correct in indicating that the perceived value in the variable node is correct. This probability is highest when the check nodes are most independent, that is, their votes carry more weight or are most valid when they are the most independent of voters. After multiple local iterations in the LDPC decoder, each check node has been influenced by other check nodes, so it is less probable when they all vote the same way that the outcome is correct.

Incorrect variable nodes are therefore identified in the LDPC decoder as variable nodes with disagreement between their received C2V messages. In some embodiments, this check is performed when the check nodes are most independent, during the first local decoding iteration of each global iteration. Once the incorrect variable nodes have been identified using this probabilistic approach, a determination is made as to whether the incorrect variable nodes form a trapping set. Again, decoding may fail in an LDPC decoder in least three scenarios, in a massive failure in which the number of unsatisfied parity checks is large, typically caused by poor signal to noise ratio (SNR), or with a mid-size failure due to clusters of interconnected trapping sets, or with a small failure with isolated trapping sets. In the former case, it can be expected that the number of unsatisfied parity checks will be relatively large. The number of unsatisfied parity checks may also be relatively large at the beginning of normal processing before converging on correct values after several decoding iterations. To filter out these conditions, in some embodiments, trapping sets are identified based on the variable nodes identified as incorrect only when the number of unsatisfied checks is within a particular range and has been so for a number of successive local decoding iterations. For example, in some embodiments, a trapping set is identified when the number of unsatisfied parity checks in a data sector being processed by an LDPC decoder is greater than 0 and less than 10 for three successive local decoding iterations. Such an embodiment can be described by the following pseudo-code, where a USC is an unsatisfied parity check:

```
If # of USC < 10 and repeats for 3 local iterations
    If (first local iteration of a global iteration)
        For each USC
            Find variable nodes with C2V message disagreements, identify
them as incorrect variable nodes
        End for
    End if
End if
```

Note that in some embodiments, incorrect variable nodes are identified during decoding in all iterations, with the detection of a trapping set taking place only when the number of unsatisfied parity checks falls within the particular range for the given number of successive local iterations. In other embodiments, incorrect variable nodes are identified only after the number of unsatisfied parity checks has fallen within the particular range for the given number of successive local iterations.

Figure 5:
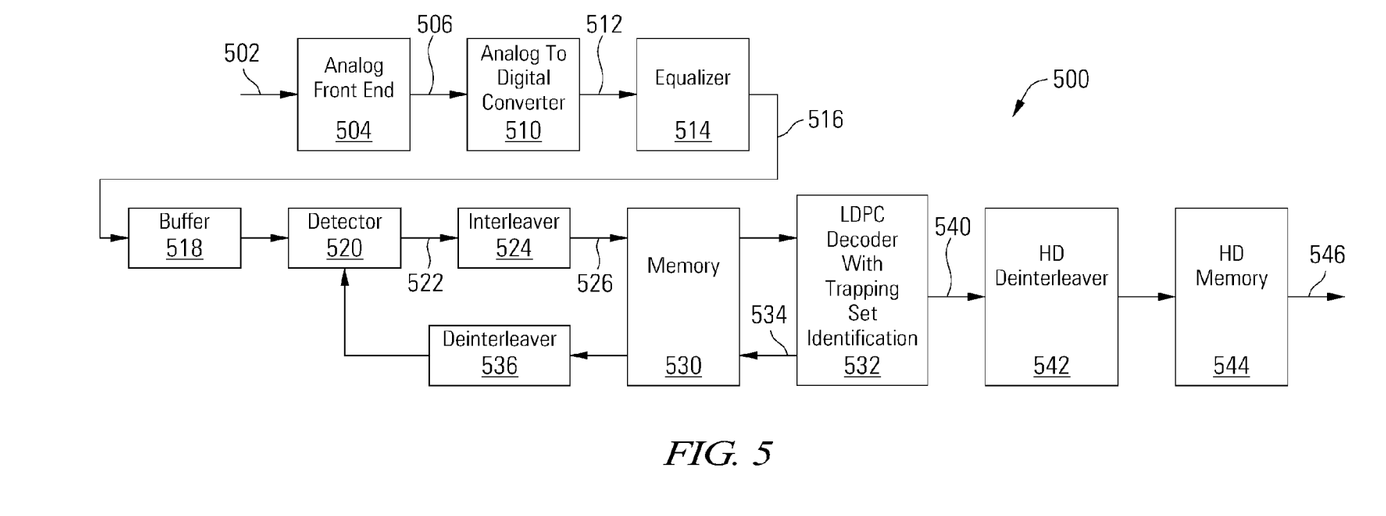
FIG. 5 depicts a read channel for a hard disk drive, incorporating an LDPC decoder implementing trapping set identification in accordance with some embodiments of the present inventions.

Turning to FIG. 5, a read channel 500 is depicted that includes an LDPC decoder with trapping set identification 532 in accordance with some embodiments of the present inventions. The read channel 500 processes an analog signal 502 to retrieve user data bits from the analog signal 502 without errors. In some cases, analog signal 502 is derived from a read/write head assembly in a magnetic storage medium. In other cases, analog signal 502 is derived from a receiver circuit that is operable to receive a signal from a transmission medium. The transmission medium may be wireless or wired such as, but not limited to, cable or optical connectivity. Based upon the disclosure provided herein, one of ordinary skill in the art will recognize a variety of sources from which analog signal 502 may be derived.

The read channel 500 includes an analog front end 504 that receives and processes the analog signal 502. Analog front end 504 may include, but is not limited to, an analog filter and an amplifier circuit as are known in the art. Based upon the disclosure provided herein, one of ordinary skill in the art will recognize a variety of circuitry that may be included as part of analog front end 504. In some cases, the gain of a variable gain amplifier included as part of analog front end 504 may be modifiable, and the cutoff frequency and boost of an analog filter included in analog front end 504 may be modifiable. Analog front end 504 receives and processes the analog signal 502, and provides a processed analog signal 506 to an analog to digital converter 510.

Analog to digital converter 510 converts processed analog signal 506 into a corresponding series of digital samples 512. Analog to digital converter 510 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 512 are provided to an equalizer 514. Equalizer 514 applies an equalization algorithm to digital samples 512 to yield an equalized output 516. In some embodiments of the present invention, equalizer 514 is a digital finite impulse response filter circuit as is known in the art. Data or codewords contained in equalized output 516 may be stored in a buffer 518 until a data detector 520 is available for processing.

The data detector 520 performs a data detection process on the received input, resulting in a detected output 522. In some embodiments of the present invention, data detector 520 is a Viterbi algorithm data detector circuit, or more particularly in some cases, a maximum a posteriori (MAP) data detector circuit as is known in the art. In these embodiments, the detected output 522 contains log-likelihood-ratio (LLR) information about the likelihood that each bit or symbol has a particular value. Based upon the disclosure provided herein, one of ordinary skill in the art will recognize a variety of data detectors that may be used in relation to different embodiments of the present invention. Data detector 520 is started based upon availability of a data set in buffer 518 from equalizer 514 or another source.

The detected output 522 from data detector 520 is provided to an interleaver 524 that protects data against burst errors. Burst errors overwrite localized groups or bunches of bits. Because LDPC decoders are best suited to correcting errors that are more uniformly distributed, burst errors can overwhelm LDPC decoders. The interleaver 524 prevents this by interleaving or shuffling the detected output 522 from data detector 520 to yield an interleaved output 526 which is stored in a memory 530. The interleaved output 526 from the memory 530 is provided to a multi-level LDPC layer decoder 532 which performs parity checks on the interleaved output 526, ensuring that parity constraints established by an LDPC encoder (not shown) before storage or transmission are satisfied in order to detect and correct any errors that may have occurred in the data during storage or transmission or during processing by other components of the read channel 500.

Multiple detection and decoding iterations may be performed in the read channel 500, both global iterations through the detector 520 and LDPC decoder 532 and local iterations within the LDPC decoder 532. To perform a global iteration, LLR values 534 from the LDPC decoder 532 are stored in memory 530, deinterleaved in a deinterleaver 536 to reverse the process applied by interleaver 524, and provided again to the data detector 520 to allow the data detector 520 to repeat the data detection process, aided by the LLR values 534 from the LDPC decoder 532. In this manner, the read channel 500 can perform multiple global iterations, allowing the data detector 520 and LDPC decoder 532 to converge on the correct data values.

The LDPC decoder 532 also produces hard decisions 540 about the values of the data bits or symbols contained in the interleaved output 526 of the interleaver 524. For binary data bits, the hard decisions may be represented as 0's and 1's. In a GF(4) LDPC decoder, the hard decisions may be represented by four field elements 00, 01, 10 and 11.

The hard decisions 540 from LDPC decoder 532 are deinterleaved in a hard decision deinterleaver 542, reversing the process applied in interleaver 524, and stored in a hard decision memory 544 before being provided to a user or further processed. For example, the output 546 of the read channel 500 may be further processed to reverse formatting changes applied before storing data in a magnetic storage medium or transmitting the data across a transmission channel.

Figure 6:
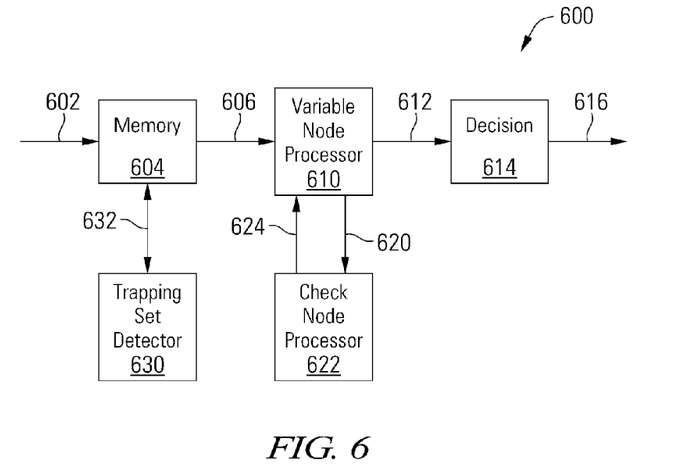
FIG. 6 depicts a block diagram of an LDPC decoder with a trapping set detector in accordance with some embodiments of the present inventions.

Turning to FIG. 6, a block diagram of an LDPC decoder with trapping set detection 600 is depicted in accordance with some embodiments of the present inventions. The LDPC decoder with trapping set detection 600 may be a binary or multi-level decoder, layered or non-layered, and is not limited to any particular algorithm for parity check calculations or message generation techniques. Input data 602 is stored in a memory 604. Input data 602 includes LLR values in some embodiments. LLR values 606 from memory 604 are provided to a variable node processor 610, which generates V2C messages 620 containing LLR values for the perceived value of each bit or symbol. A check node processor 622 receives the V2C messages 620 and performs parity check calculations for each check node based on messages from connected variable nodes. The check node processor 622 also generates C2V messages 624, enabling the variable node processor 610 to update the perceived value for each variable node based on C2V messages 624 from connected check nodes. Updated variable node values may also be updated in the memory 604 during local decoding iterations, either by the variable node processor 610 or check node processor 622 or both. LLR values 612 from the variable node processor 610 may also be provided to a decision circuit 614 which generates a hard decision output 616.

A trapping set detector 630 in the LDPC decoder with trapping set detection 600 monitors the number of unsatisfied checks from each local iteration, determines whether the number of unsatisfied checks falls within a particular range, tracks the number of unsatisfied checks across successive decoding iterations and determines whether the number of unsatisfied checks has fallen within a particular range for a particular number of successive iterations. If these conditions are met, the trapping set detector 630 determines that a trapping set exists. The trapping set detector 630 identifies the variable nodes in the trapping set as those corresponding to the unsatisfied checks and having disagreement between incoming C2V messages during the first local iteration of a global iteration.

In some embodiments, when these trapping set conditions exist, the trapping set detector 630 watches the number of unsatisfied checks and the number of consecutive iterations in which the number of unsatisfied checks is within the particular range, continuing to make sure that these conditions remain in place until reaching the first local iteration of a global iteration. When the first local iteration of a global iteration is reached and the number of unsatisfied checks has fallen within the range for the particular number of successive iterations, the trapping set detector 630 then identifies, for each variable node associated with each unsatisfied parity check, which had C2V message disagreements during that first local iteration of a global iteration, and identifying them as members of the trapping set.

Figure 7:
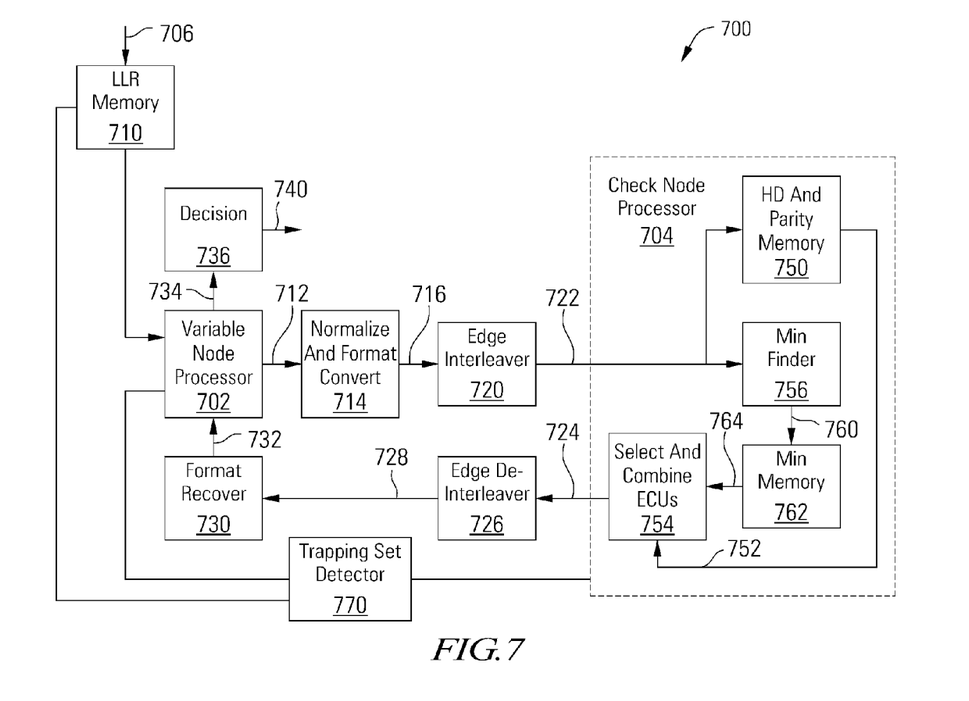
FIG. 7 depicts a block diagram of a multi-level min-sum based LDPC decoder with a trapping set detector in accordance with some embodiments of the present inventions.

Turning to FIG. 7, in some embodiments, the LDPC decoder with trapping set identification is a min-sum based LDPC decoder 700 in which check nodes calculate a minimum, next minimum and hard decision value based on incoming V2C or variable node message vectors. However, it is important to note that the LDPC decoder with trapping set identification is not limited to the min-sum based non-binary LDPC decoder 700 of FIG. 7, but that any suitable LDPC decoder may be operable to implement the trapping set identification disclosed herein.

The min-sum based non-binary LDPC decoder 700 is provided with an input 706, for example containing a hard decision and corresponding LLR values, which are stored in a symbol memory 710. The input 706 is provided to the variable node processor 702 from the symbol memory 710, and the variable node processor 702 updates the perceived value of each symbol based on the value from input 706 and on C2V message vectors or check node messages from a check node processor 704. The variable node processor 702 also generates V2C message vectors 712 or variable node messages for neighboring check nodes.

Check nodes (implemented in check node processor 704) in a min-sum based non-binary LDPC decoder receive incoming messages from connected or neighboring variable nodes (implemented in variable node processor 702) and generate outgoing messages to each neighboring variable node to implement the parity check matrix for the LDPC code, an example of which is graphically illustrated in the Tanner graph of FIG. 1. Incoming messages to check nodes are also referred to herein as V2C messages, indicating that they flow from variable nodes to check nodes, and outgoing messages from check nodes are also referred to herein as C2V messages, indicating that they flow from check nodes to variable nodes. The check node uses multiple V2C messages to generate an individualized C2V message with for each neighboring variable node.

In various embodiments of LDPC decoders that may be adapted to include trapping set identification, the variable node processor 702 and check node processor 704 may each be unitary, discrete components, or their functions may be distributed and intermixed in multiple components. The terms variable node processor and check node processor are therefore not limited to two discrete processing components, but apply generally to any components or combinations of components in an LDPC decoder that update variable node values and generate variable node to check node messages for variable node processing, and that perform check node constraint calculations and generate check node to variable node messages for check node processing.

Both V2C and C2V messages in this embodiment are vectors, each including a number of sub-messages with LLR values. Each V2C message vector from a particular variable node contains sub-messages corresponding to each symbol in the Galois Field, with each sub-message giving the likelihood that the variable node contains that particular symbol. For example, given a Galois Field GF(q) with q elements, V2C and C2V messages will include at least q sub-messages representing the likelihood for each symbol in the field.

Generally, the C2V vector message from a check node to a variable node contains the probabilities for each symbol d in the Galois Field that the destination variable node contains that symbol d, based on the prior round V2C messages from neighboring variable nodes other than the destination variable node. The inputs from neighboring variable nodes used in a check node to generate the C2V message for a particular neighboring variable node are referred to as extrinsic inputs and include the prior round V2C messages from all neighboring variable nodes except the particular neighboring variable node for which the C2V message is being prepared, in order to avoid positive feedback. The check node thus prepares a different C2V message for each neighboring variable node, using the different set of extrinsic inputs for each message based on the destination variable node.

In the min-sum based decoding disclosed herein, the check nodes calculate the minimum sub-message $min_1(d)$, the index idx(d) of $min_1(d)$, and the sub-minimum sub-message $min_2(d)$, or minimum of all sub-messages excluding $min_1(d)$, for each nonzero symbol d in the Galois Field based on all extrinsic V2C messages from neighboring variable nodes. In other words, the sub-messages for a particular symbol d are gathered from messages from all extrinsic inputs, and the $min_1(d)$, idx(d) and $min_2(d)$ is calculated based on the gathered sub-messages for that symbol d. For a Galois Field with q symbols, the check node will calculate the $min_1(d)$, idx(d) and $min_2(d)$ sub-message for each of the q−1 non-zero symbols in the field except the most likely symbol.

The V2C message vectors 712 from the variable node processor 702 are provided to a message format converter 714 which converts the format of V2C message vectors 712 to a format consisting of two parts, the most likely symbol, and the LLR of other symbols, normalized to the most likely symbol, yielding normalized V2C message vectors 716 in the second format. Message normalization in the message format converter 714 is performed with respect to the most likely symbol. Thus, the V2C and C2V vector format includes two parts, an identification of the most likely symbol and the LLR for the other q−1 symbols, since the most likely symbol has LLR equal to 0 after normalization. The normalized V2C message vectors 716 are provided to an edge interleaver 720 which shuffles messages on the boundaries at message edges, randomizing noise and breaking dependencies between messages. The interleaved normalized V2C message vectors 722 are provided to the check node processor 704, which generates C2V messages 724 for each neighboring variable node processor based on extrinsic V2C messages from other neighboring variable node processors.

The C2V messages 724 are provided to an edge de-interleaver 726, which reverses the process of the edge interleaver 720, and then to a format recovery circuit 730, which converts message vectors from the second, normalized format to the first message vector format of the variable node processor 702, reversing the process of the message format converter 714. The resulting first format C2V messages 732 are provided to the variable node processor 702 for use in updating perceived LLR values in variable nodes. In other embodiments, the variable node processor 702 is adapted to operate directly with message vectors of the second, normalized format. In these embodiments, the message format converter 714 and format recovery circuit 730 are omitted.

When the values in the min-sum based non-binary LDPC decoder 700 converge and stabilize, or when a limit is reached on the number of local iterations, the variable node processor 702 provides the total LLR $S_n(a)$ 734 to a decision circuit 736 to generate a hard decision 740 based on the $argmin_a$ of the total LLR $S_n(a)$.

The check node processor 704 includes a hard decision and parity memory circuit 750 that processes the interleaved normalized V2C message vectors 722 to provide the most likely symbol 752 to a select and combine circuit 754 having a number of elementary computation units (ECUs). The check node processor 704 also includes a min finder 756 that calculates the $min_1(d)$, idx(d) and $min_2(d)$ sub-messages 760 for each of the q symbols in the Galois Field and stores them in a min memory 762. The stored $min_1(d)$ idx(d) and $min_2(d)$ sub-messages 764 are provided by min memory 762 to the select and combine circuit 754. The select and combine circuit 754 combines the $min_1(d)$ idx(d) and $min_2(d)$ sub-messages 764 and the most likely symbol 752 to generate the C2V messages 724.

The message vector format conversion performed by message format converter 714 on V2C message vectors 712 is reversed by format recovery circuit 730, providing C2V messages 732 to variable node processor 702 in the format used by the variable node processor 702.

A trapping set detector 770 in the min-sum based non-binary LDPC decoder 700 monitors the number of unsatisfied checks from each local iteration, determines whether the number of unsatisfied checks falls within a particular range, tracks the number of unsatisfied checks across successive decoding iterations and determines whether the number of unsatisfied checks has fallen within a particular range for a particular number of successive iterations. When these conditions are met at the first local iteration of a global iteration, the trapping set detector 770 identifies the variable nodes in a trapping set as those corresponding to the unsatisfied checks and having disagreement between incoming C2V messages.

Figure 8:
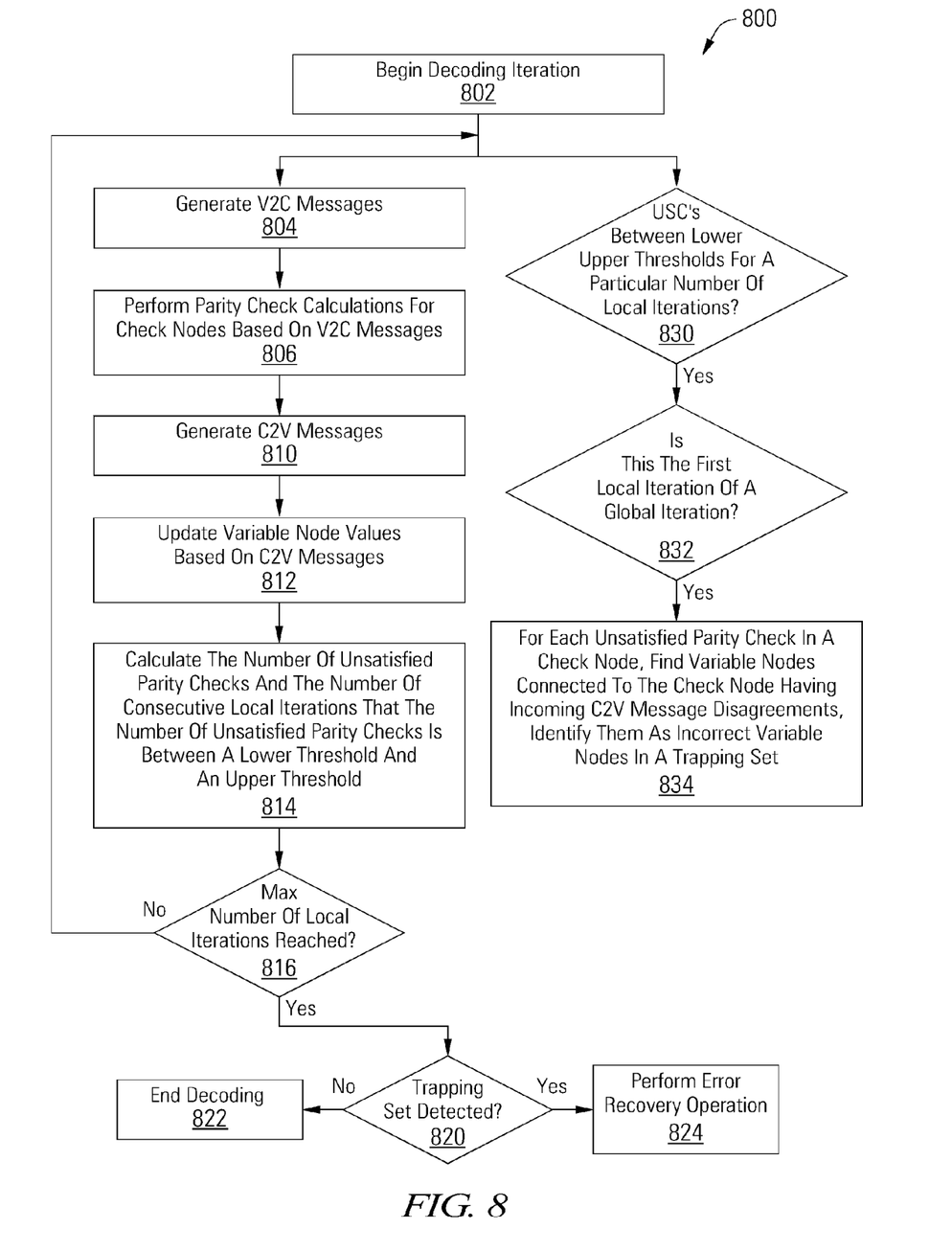
FIG. 8 depicts a flow diagram of an LDPC decoding operation with trapping set identification in accordance with some embodiments of the present inventions.

Turning to FIG. 8, a flow diagram 800 is depicted of a decoding operation in a LDPC decoder with trapping set identification in accordance with various embodiments of the present inventions. Following flow diagram 800, the decoding iteration is started (block 802) based on input data to the LDPC decoder or with data derived from input data and subsequently modified during a previous local decoding iteration. V2C messages are generated. (Block 804) V2C messages may be generated, for example, in a variable node processor based on perceived values of data bits or symbols in data being decoded. Parity check calculations are performed for check nodes based on the V2C messages received at each check node. (Block 806) C2V messages are generated. (Block 810) C2V messages may be generated, for example, in a check node processor based on the parity check calculations. Variable node values are updated based on the C2V messages. (Block 812) The number of unsatisfied parity checks is calculated, along with the number of consecutive local iterations in which the number of unsatisfied parity checks is between a lower threshold and an upper threshold. (Block 814) If the maximum number of local iterations has not been reached (block 816), the next local iteration is performed. Otherwise, a determination is made as to whether a trapping set exists. (Block 820) A trapping set may be detected, for example, when the number of unsatisfied parity checks has been between the lower and upper thresholds for a particular number of consecutive iterations. In some embodiments, the lower threshold is 1 and the upper threshold is 10, and the number of unsatisfied parity checks must remain within this range for at least 3 consecutive local decoding iterations for a trapping set to be detected. If a trapping set is detected (block 820), one or more error recovery operations may be performed (block 824), such as targeted symbol flipping, in an effort to cause the data to converge on the correct values despite the trapping set. If a trapping set is not detected (block 820), decoding is finished (block 822) and hard decisions may be provided at an output of the LDPC decoder.

The trapping set identification may be performed in parallel with one or more of the above-disclosed operations, or in serial. A determination is made as to whether the number of unsatisfied checks has been between the lower and upper thresholds for a particular number of local iterations. (Block 830) If so, a determination is made as to whether the decoder is in the first local iteration of a global iteration. (Block 832) If so, for each unsatisfied parity check, the corresponding variable nodes are identified as incorrect variable nodes in the trapping set if they have disagreements in their incoming C2V messages. (Block 834)

Figure 9:
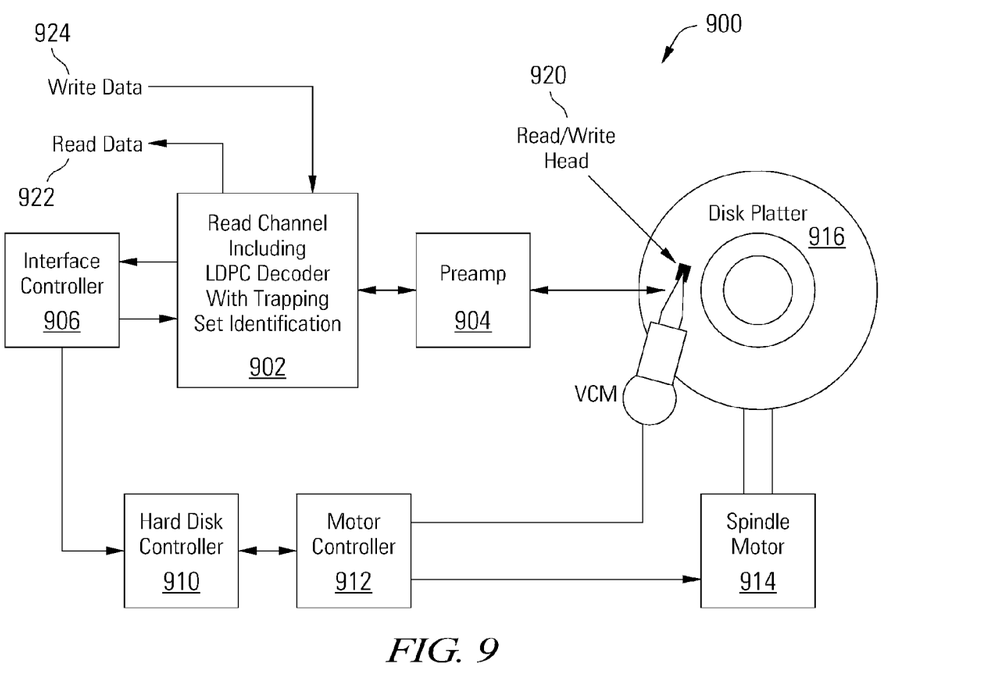
FIG. 9 depicts a storage system including a data processing circuit with an LDPC decoder with trapping set identification in accordance with some embodiments of the present inventions.
Figure 10:
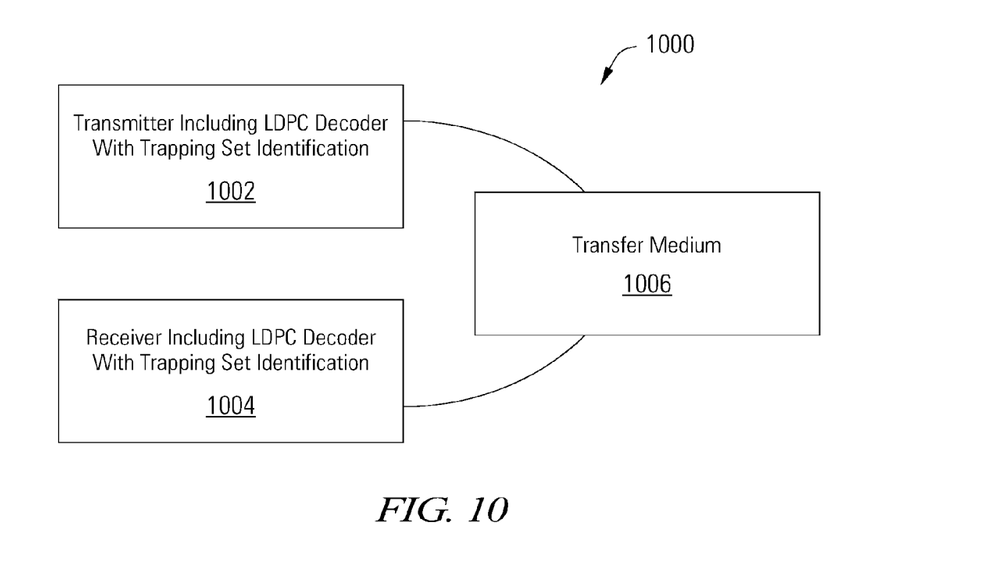
FIG. 10 depicts a wireless communication system including a data processing circuit with an LDPC decoder with trapping set identification in accordance with some embodiments of the present inventions.

Although the LDPC decoder trapping set identification disclosed herein is not limited to any particular application, several examples of applications are presented in FIGS. 9 and 10 that benefit from embodiments of the present inventions. Turning to FIG. 9, a storage system 900 including a read channel circuit 902 having an LDPC decoder with trapping set identification is shown in accordance with some embodiments of the present inventions. Storage system 900 may be, for example, a hard disk drive. Storage system 900 also includes a preamplifier 904, an interface controller 906, a hard disk controller 910, a motor controller 912, a spindle motor 914, a disk platter 916, and a read/write head 920. Interface controller 906 controls addressing and timing of data to/from disk platter 916. The data on disk platter 916 consists of groups of magnetic signals that may be detected by read/write head assembly 920 when the assembly is properly positioned over disk platter 916. In one embodiment, disk platter 916 includes magnetic signals recorded in accordance with either a longitudinal or a perpendicular recording scheme.

In a typical read operation, read/write head assembly 920 is accurately positioned by motor controller 912 over a desired data track on disk platter 916. Motor controller 912 both positions read/write head assembly 920 in relation to disk platter 916 and drives spindle motor 914 by moving read/write head assembly to the proper data track on disk platter 916 under the direction of hard disk controller 910. Spindle motor 914 spins disk platter 916 at a determined spin rate (RPMs). Once read/write head assembly 920 is positioned adjacent the proper data track, magnetic signals representing data on disk platter 916 are sensed by read/write head assembly 920 as disk platter 916 is rotated by spindle motor 914. The sensed magnetic signals are provided as a continuous, minute analog signal representative of the magnetic data on disk platter 916. This minute analog signal is transferred from read/write head assembly 920 to read channel circuit 902 via preamplifier 904. Preamplifier 904 is operable to amplify the minute analog signals accessed from disk platter 916. In turn, read channel circuit 902 decodes and digitizes the received analog signal to recreate the information originally written to disk platter 916. This data is provided as read data 922 to a receiving circuit. As part of decoding the received information, read channel circuit 902 processes the received signal using an LDPC decoder with trapping set identification. Such an LDPC decoder with trapping set identification may be implemented consistent with that disclosed above in relation to FIGS. 3-6. In some cases, the LDPC decoder with trapping set identification may be done consistent with the flow diagram disclosed above in relation to FIG. 8. A write operation is substantially the opposite of the preceding read operation with write data 924 being provided to read channel circuit 902. This data is then encoded and written to disk platter 916. It should be noted that various functions or blocks of storage system 900 may be implemented in either software or firmware, while other functions or blocks are implemented in hardware.

Storage system 900 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 900, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Turning to FIG. 10, a data transmission system 1000 including a receiver 1004 having an LDPC decoder with trapping set identification is shown in accordance with various embodiments of the present invention. Data transmission system 1000 includes a transmitter 1002 that is operable to transmit encoded information via a transfer medium 1006 as is known in the art. The encoded data is received from transfer medium 1006 by a receiver 1004. Receiver 1004 processes the received input to yield the originally transmitted data. As part of processing the received information, receiver 1004 decodes received data with an LDPC decoder with trapping set identification. In some cases, receiver 1004 may be implemented to include an LDPC decoder with trapping set identification similar to that disclosed in relation to FIGS. 3-6. Further, the LDPC decoder with trapping set identification may be accomplished consistent with the approach disclosed in relation to FIG. 8.

It should be noted that the various blocks discussed in the above application may be implemented in integrated circuits along with other functionality. Such integrated circuits may include all of the functions of a given block, system or circuit, or a portion of the functions of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel systems, devices, methods and arrangements for an LDPC decoder with trapping set identification. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus comprising:
a low density parity check decoder operable to iteratively generate and process check node to variable node messages and variable node to check node messages, and to identify trapping sets based at least in part on disagreements between the check node to variable node messages, wherein the low density parity check decoder comprises a non-erasure channel decoder.

2. The apparatus of claim 1, wherein the low density parity check decoder comprises a variable node processor operable to generate the variable node to check node messages, a check node processor operable to generate the check node to variable node messages, and a trapping set detector operable to identify the trapping sets.

3. The apparatus of claim 1, wherein the low density parity check decoder is operable to calculate a number of unsatisfied parity checks for each local decoding iteration and to determine when the number of unsatisfied parity checks is within a range.

4. The apparatus of claim 3, wherein the low density parity check decoder is further operable to determine when the number of unsatisfied parity checks is within the range for at least a number of local decoding iterations.

5. The apparatus of claim 4, wherein the low density parity check decoder is further operable to identify the trapping sets when the number of unsatisfied parity checks has been within the range for at least the number of local decoding iterations.

6. The apparatus of claim 1, wherein the low density parity check decoder is operable to identify variable nodes in the trapping sets as those with the disagreements between the check node to variable node messages received by the variable nodes.

7. The apparatus of claim 6, wherein the low density parity check decoder is operable to identify the variable nodes in the trapping sets as those associated with unsatisfied parity checks.

8. The apparatus of claim 6, wherein the low density parity check decoder is operable to identify the variable nodes in the trapping sets during a first local iteration of a global decoding iteration.

9. The apparatus of claim 8, further comprising a data detector operable to provide input data to the low density parity check decoder during the global decoding iteration.

10. The apparatus of claim 1, further comprising performing an error recovery operation in the low density parity check decoder based upon the identification of the trapping sets.

11. The apparatus of claim 1, wherein the apparatus is implemented as an integrated circuit.

12. The apparatus of claim 1, wherein the apparatus is incorporated in a storage device.

13. The apparatus of claim 12, wherein the storage device comprises a redundant array of independent disks.

14. The apparatus of claim 1, wherein the apparatus is incorporated in a transmission system.

15. A method for identifying a trapping set in a non-erasure channel low density parity check decoder, comprising:
calculating a number of unsatisfied parity checks for each of a plurality of local decoding iterations;
determining whether the number of unsatisfied parity checks is within a range;
determining whether the number of unsatisfied parity checks has been within the range for a number of the local decoding iterations; and
identifying variable nodes in the trapping set based at least in part on disagreements in check node to variable node messages to the variable nodes.

16. The method of claim 15, wherein the variable nodes are identified during a first local decoding iteration of a global decoding iteration.

17. The method of claim 15, wherein the variable nodes identified in the trapping set comprise each variable node in an H-matrix for the non-erasure channel low density parity check decoder having a disagreement in received check node to variable node messages during a local decoding iteration.

18. The method of claim 15, further comprising performing an error recovery operation based on the trapping set.

19. The method of claim 18, wherein the error recovery operation comprises targeted symbol flipping.

20. A storage system comprising:
a storage medium maintaining a data set;
a read/write head assembly operable to sense the data set on the storage medium; and
a data processing circuit operable to correct errors in the data set, wherein the data processing circuit comprises a low density parity check decoder operable to iteratively generate and process check node to variable node messages and variable node to check node messages, and to identify trapping sets based at least in part on disagreements between the check node to variable node messages when the check node to variable node messages to a variable node disagree about a value of the variable node, wherein the low density parity check decoder comprises a non-erasure channel decoder.

* * * * *